United States Patent [19]

Breneman

[11] Patent Number: 4,676,967

[45] Date of Patent: Jun. 30, 1987

[54] HIGH PURITY SILANE AND SILICON PRODUCTION

[75] Inventor: William C. Breneman, East Amherst, N.Y.

[73] Assignee: Union Carbide Corporation, Danbury, Conn.

[21] Appl. No.: 363,823

[22] Filed: Mar. 31, 1982

Related U.S. Application Data

[63] Continuation-in-part of Ser. No. 936,091, Aug. 23, 1978, abandoned.

[51] Int. Cl.⁴ ............................................. C01B 33/04
[52] U.S. Cl. ................................... 423/347; 423/342; 423/349; 423/350
[58] Field of Search ............... 423/342, 347, 350, 342, 423/349

[56] References Cited

U.S. PATENT DOCUMENTS

| | | | |
|---|---|---|---|
| 2,595,620 | 5/1952 | Wagner et al. | 423/342 |
| 3,012,861 | 12/1961 | Ling | 423/349 |
| 3,012,862 | 12/1961 | Bertrand | 423/350 |
| 3,367,768 | 2/1968 | West et al. | |
| 3,968,199 | 7/1976 | Bakay | 423/347 |
| 3,979,450 | 9/1976 | Dietze et al. | 264/81 |
| 3,979,490 | 9/1976 | Dietze et al. | 264/81 |
| 4,113,845 | 9/1978 | Litteral | 423/347 |
| 4,117,094 | 9/1978 | Blocher et al. | 423/350 X |

FOREIGN PATENT DOCUMENTS

| | | |
|---|---|---|
| 752280 | 3/1941 | Fed. Rep. of Germany . |
| 1153000 | 8/1963 | Fed. Rep. of Germany . |
| 1180346 | 7/1965 | Fed. Rep. of Germany . |
| 1126842 | 5/1966 | Fed. Rep. of Germany . |
| 904009 | 8/1962 | United Kingdom ............... 423/342 |

OTHER PUBLICATIONS

DOE/JPL 954334—77/4 Quarterly Progress Report, Jul.-Sep. 1977.
DOE/JPL 954334-78/5 Quarterly Progress Report, Oct.-Dec. 1977.
DOE/JPL 954334-78/6 Quarterly Progress Report, Jan.-Mar. 1978.
Breneman et al., "Low Cost Silicon Solar-Array Project", Quarterly Report-JPL 954334, Jul.-Oct. 1976.
Breneman et al., "Low Cost Silicon Solar Array Project", Quarterly Report-JPL 954334, Jan.-Mar. 1977.
Breneman, "Low Cost Silicon Solar Array Project", Monthly Report JPL 954334, Feb. 1976.

Primary Examiner—William R. Dixon, Jr.
Assistant Examiner—Steven Capella
Attorney, Agent, or Firm—Morris N. Reinisch

[57] ABSTRACT

Silicon tetrachloride, hydrogen and metallurgical silicon are reacted at about 400°-600° C. and at pressures in excess of 100 psi, and specifically from about 300 up to about 600 psi to form di- and trichlorosilane that is subjected to disproportionation in the presence of an anion exchange resin to form high purity silane. By-product and unreacted materials are recycled, with metallurgical silicon and hydrogen being essentially the only consumed feed materials. The silane product may be further purified, as by means of activated carbon or cryogenic distillation, and decomposed in a fluid bed or free space reactor to form high purity polycrystalline silicon and by-product hydrogen which can be recycled for further use. The process results in simplified waste disposal operations and enhances the overall conversion of metallurgical grade silicon to silane and high purity silicon for solar cell and semiconductor silicon applications.

22 Claims, 1 Drawing Figure

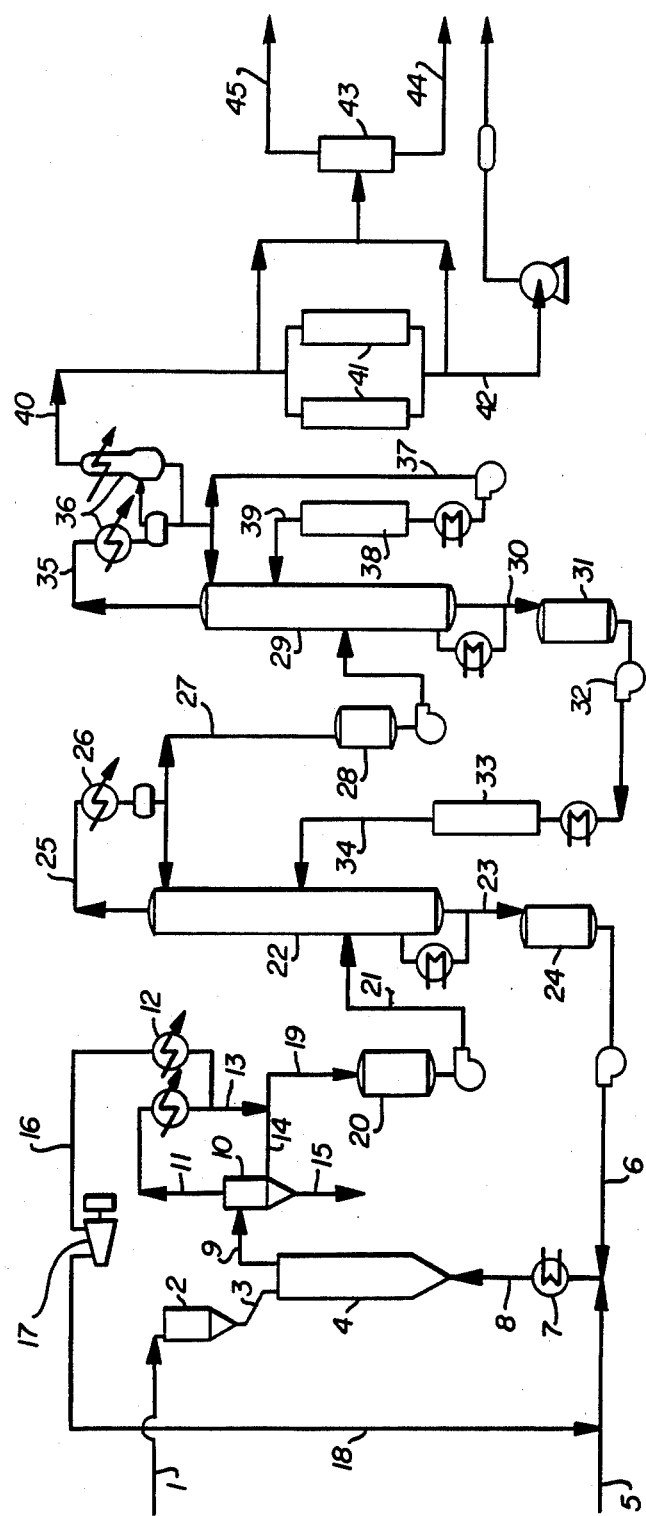

HIGH PURITY SILANE AND SILICON PRODUCTION

STATEMENT

The invention described herein was made in the performance of work under NASA Contract Number NAS 7-100, JPL No. 954334, for high purity silicon, and is subject to the provisions of Section 305 of the National Aeronautic and Space Act of 1958 (72 Stat. 435; 42 U.S.C. 2457).

CROSS REFERENCE TO RELATED APPLICATION

This application is a continuation-in-part of applicant's co-pending parent application, Ser. No. 936,091, filed Aug. 23, 1978 abandoned.

BACKGROUND OF THE INVENTION

1. Field of the Invention

The invention relates to the production of high purity silane and silicon. More particularly, it relates to an improved process for enhancing the production of said desired products.

2. Description of the Prior Art

The development of new techniques for the utilization of non-polluting sources of energy is of paramount national and world-wide interest. Solar energy is among the energy sources of greatest interest because of its non-polluting nature and its abundant, non-diminishing availability. One approach to the utilization of solar energy involves the conversion of solar energy into electricity by means of the photovoltaic effect upon the absorption of sunlight by solar cells.

Silicon solar cells, the most commonly employed devices based on the photovoltaic effect, have been employed reliably in space craft applications for many years. For such applications and for industrial and commercial applications in general, crystals of high purity, semiconductor grade silicon are commonly employed. Such high purity, high perfection silicon is generally produced by procedures involving converting metallurgical grade silicon to volatile trichlorosilane, which is then refined by the chemical and physical methods and finally reduced to produce polycrystalline, semiconductor grade silicon from which single crystals can be grown. The costs associated with the production of such high purity, high perfection crystals are high.

The initial step of converting metallurgical silicon to trichlorosilane has commonly been carried out by reacting metallurgical grade silicon with HCl in a fluid bed reaction zone at about 300° C. Trichlorosilane comprises about 85% of the resulting reaction mixture, which also contains silicon tetrachloride, dichlorosilane, polysilanes and metal halides. While this technique has been employed successfully in commercial practice, it requires the use of relatively large reaction vessels and the consumption of excess quantities of metallurgical silicon. In addition, the reaction mixture is relatively difficult to handle and has associated waste disposal problems that contribute to the cost of the overall operation.

In producing high purity polycrystalline silicon from trichlorosilane, current commercial technology is a low volume, batch operation generally referred to as the Siemens process. This technology is carried out in the controlled atmosphere of a quartz bell jar reactor that contains silicon rods electrically heated to about 1100° C. The chlorosilane, in concentrations of less than 10% in hydrogen, is fed to the reactor under conditions of gas flow rate, composition, silicon rod temperature and bell jar temperature adjusted so as to promote the heterogeneous decomposition of the chlorosilane on the substrate rod surfaces. A general description of the Siemens type process can be found in the Dietze et al patent, U.S. Pat. No. 3,979,490.

Polycrystalline semiconductor grade silicon made from metallurgical grade silicon costing about $0.50/lb. will, as a result of the cost of such processing, presently cost on the order of about $30/lb. and up. In growing a single crystal from this semiconductor grade material, the ends of the single crystal ingot are cut off, and the ingot is sawed, etched and polished to produce polished wafers for solar cell application, with mechanical breakage and electronic imperfection reducing the amount of useable material obtained. As a result, less than 20% of the original polycrystalline, semiconductor grade silicon will generally be recoverable in the form of useable wafers of single crystal material. The overall cost of such useable material is, accordingly, presently on the order of about $300/lb. and up. Because of the relatively large area requirements involved in solar cell applications, such material costs are a significant factor in the overall economics of such applications.

The economic feasibility of utilizing solar cell technology for significant portions of the present and prospective needs for replenishable, non-polluting energy sources would be enhanced, therefore, if the overall cost of high purity single crystal wafers could be reduced. One area of interest, in this regard, relates to the development of a low-cost, continuous process for the production of polycrystalline silicon from silane or chlorosilanes. The decomposition of such silanes in a fluid bed reaction zone is disclosed in Ling, U.S. Pat. Nos. 3,012,861 and Bertrand, 3,012,862. Another approach for the continuous production of silicon from silane is that disclosed in German Patent Specification Nos. 752,280, published May 26, 1953, and 1,180,346, published July 1, 1965. In this approach, the silane is heated to above its decomposition temperature quickly in a nozzle and is then caused to expand into a substantially cooler chamber from the bottom of which silicon product is collected. A second area of interest of the development of lower cost has been the production of silane by the disproportionation of trichlorosilane. One suggested approach involves the use of a bed of insoluble, solid anion exchange resin in a distillation system from which silane is recovered at the top and from which $SiCl_4$ is withdrawn at the bottom as disclosed in Bakay, U.S. Pat. No. 3,968,199. Another area of interest resides, of course, in the initial production of trichlorosilane from the metallurgical grade silicon. Improved processing permitting a reduction in the number or size of the reaction vessels employed, or simplifying the handling of the reaction mixture and reducing the waste disposal problems involved, would contribute significantly to the overall reduction in the cost of high purity silane and/or silicon. Such reduction in costs through simplified processing operations is desired in the art not only in the field of solar cell technology, but to enhance the prospects for the use of such high purity silicon for semiconductor applications as well. In addition to such specific areas of interest for possible processing improvement, a genuine need exists for integrated overall processing improvements to reduce overall costs, simplify feed material requirements and reduce waste disposal and other material disposal considerations. For example, the Bakay process referred to above produces by-product $SiCl_4$, which must be utilized, sold or otherwise disposed of in the overall processing operation. The commonly employed process for producing trichlorosilane, on the other hand, requires a source of HCl, adding to the cost and the material handling requirements of the process. An integrated process for the conversion of metallurgical grade silicon to high purity silane and silicon, with simplified material requirements and reduced waste disposal, is genuinely needed in the art, therefore, to enhance the prospects for effectively utilizing high purity silicon on a commercially practical basis for solar cell and semiconductor applications.

It is an object of the present invention, therefore, to provide an improved process for the production of high purity silane.

It is another object of the invention to provide an improved process for the conversion of metallurgical grade silicon to high purity silane and high purity silicon.

It is another object to provide an integreted process for the production of high purity silane and high purity silicon with simplified feed material and reduced material disposal requirements.

It is a further object of the invention to provide a process for the production of silane from metallurgical grade silicon incorporating an enhanced process for the initial production of trichlorosilane from metallurgical grade silicon.

With these and other objects in mind, the invention is hereinafter disclosed in detail, the novel features thereof being particularly pointed out in the appended claims.

SUMMARY OF THE INVENTION

High purity silane is produced by an improved, integrated process utilizing hydrogen and metallurgical grade silicon as essentially the only consumed feed materials. The initial trichlorosilane production is accomplished at elevated pressure and temperature, with said pressure being from about 300 to about 600 psi, substantially enhancing the conversion rate and the production rate obtainable in a given size reaction vessel. Unreacted silicon tetrachloride is conveniently recycled for reaction with additional quantities of hydrogen and metallurgical silicon. Material wastage is minimized, and waste disposal is readily accomplished by condensing a minor portion of unreacted silicon tetrachloride from the trichlorosilane reaction mixture, said silicon tetrachloride and accompanying impurities being passed to waste without the necessity for dilution prior to hydrolysis during said waste disposal. The high purity silane thus produced can be further purified to remove residual impurities, as required, and may be decomposed on a continuous or semicontinuous basis to produce high purity silicon, e.g., in the hot free space of a decomposition reactor or in a fluid bed reaction zone. By-product hydrogen produced in the silane decomposition operation can conveniently be recycled to the trichlorosilane production step and/or recycled for use as a carrier gas for the silane being decomposed as desired.

BRIEF DESCRIPTION OF THE DRAWINGS

The invention is further described with reference to the accompanying drawing illustrating the process flow diagram of one embodiment of the invention for converting metallurgical grade silicon to high purity silicon.

DETAILED DESCRIPTION OF THE INVENTION

The process of the invention as herein described and claimed is an integrated process of enhanced performance capability for producing high purity silane or high purity silicon from metallurgical grade silicon. The invention achieves higher performance efficiency and reduced equipment size requirements than previously known techniques. The overall process includes (1) the enhanced production of trichlorosilane from metallurgical silicon and hydrogen, (2) the disproportionation of trichlorosilane to produce high purity silane, and (3) the conversion of said silane to high purity silicon, if desired. The integrated process effectively recycles unreacted and by-product materials, minimizing material wastage and simplifying waste disposal operations.

The present invention is suitable for use in the conversion of the conventional metallurgical grade silicon materials available in the art to high purity silane or high purity silicon. Metallurgical grade silicon, as referred to herein, is a grade of silicon having a resistivity generally on the order of about 0.005 ohm-cm and up to about 3% iron, 0.75% aluminum, 0.5% calcium and other impurities normally found in silicon produced by the carbothermic reduction of silica. It is also within the scope of the invention to employ a ferro-silicon material containing at least about 90% Si and up to 10% or more of iron. It will also be understood by those skilled in the art that suitable grades of ferro-silicon material are included within the meaning of the term "metallurigical silicon," as used herein. It will also be understood that particular grades of metallurgical silicon containing unusual concentrations of certain specific impurities, perhaps for example 1% or more of lead, may not be suitable feed material for the process.

Metallurgical grade silicon or ferro-silicon is processed, in accordance with the invention, to produce an initial reaction mixture of di- and trichlorosilane by a novel and advantageous technique that enables the overall process to be carried out in an economically advantageous manner, with the desirable by-product recycle and simplified waste disposal referred to herein. As silicon tetrachloride separated from the reaction mixture can readily be recycled for reaction with additional quantities of metallurgical silicon and hydrogen, high purity silane is produced with said metallurgical silicon and hydrogen being essentially the only major consumed feed materials.

In the process of the invention, metallurgical silicon is initially reacted with hydrogen and silicon tetrachloride in a reaction zone maintained at a temperature of from about 400° C. to about 600° C. and at a pressure in excess of about 100 psi, and specifically in the range of from about 300 to about 600 psi, to form trichlorosilane as follows:

(1) $3SiCl_4 + 2H_2 + Si$ (met. grade) 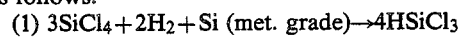 $4HSiCl_3$ with the reaction (1) mixture containing a yield of about 20-30% by weight trichlorosilane on a hydrogen-free basis, and of about 0.5% dichlorosilane with the remainder being silicon tetrachloride together with impurities comprising mainly carryover metallurgical silicon powder, hydrogen chloride, metal halides essentially without undesired polysilanes.

The elevated pressure and temperature in the reaction zone substantially enhances the production rate obtainable in a given sized reaction vessel and the feed conversion rate, thereby reducing the size requirements for reaction vessels and facilitating the overall production operation. Additional advantages of the invention in providing an integrated process for the production of high purity silane and high purity silicon, with simplified feed material and reduced material disposal requirements, are hereinafter pointed out with reference to particular aspects and embodiments of the invention.

In the embodiment of the invention illustrated in the drawing, metallurgical silicon is passed through line 1, lock hopper 2 and line 3 into hydrogenation reactor 4 in which said silicon is reacted with hydrogen and silicon tetrachloride in accordance with reaction (1) under the reaction conditions herein disclosed. Hydrogen from line 5 and recycle silicon tetrachloride from line 6 are passed through vaporizer/preheater 7 to reach the desired reaction temperature and are passed therefrom through line 8 to said reactor 4.

The reaction mixture from reactor 4 comprises trichlorosilane, dichlorosilane, silicon tetrachloride, carryover metallurgical silicon powder, metal halides and other impurities. This trichlorosilane gas stream, upon leaving reactor 4 through line 9 is cooled to condense a minor portion of the unreacted silicon tetrachloride therein, with said carryover metallurgical silicon, metal halides and other impurities present in said trichlorosilane gas stream separating therefrom with the condensed silicon tetrachloride.

For this purpose, the trichlorosilane gas stream in line 9 passes to settling zone 10 from which the gas stream passes upward through line 11 to condenser unit 12 from which the partially condensed stream exits through line 13. A minor portion of the unreacted silicon tetrachloride, for example on the order of about 5% by weight of the overall silicon tetrachloride in said trichlorosilane gas stream, together with accompanying carryover silicon powder and other impurities is returned through line 14 to settling zone 10 from which a waste stream is removed through line 15 for convenient disposal as the only waste stream of the overall integrated process of the invention. Hydrogen gas withdrawn from condenser unit 12 is passed through line 16 to hydrogen recycle blower 17 from which said hydrogen is passed in line 18 for recycle to line 5 for passage with fresh hydrogen to reactor 4 for reaction therein with additional quantities of fresh metallurgical silicon.

The trichlorosilane gas stream from line 13, purified of said impurities and containing said dichlorosilane and the remainder of said silicon tetrachloride, passes through line 19 to surge tank 20 from which it is pumped through line 21 to distillation zone 22 from which trichlorosilane and dichlorosilane are separated as overhead from the unreacted silicon tetrachloride, which is withdrawn from the bottom of said distillation zone 22 through line 23, passes to surge tank 24 and is pumped through line 6 so as to pass to reactor 4 for reaction therein with additional quantities of metallurgical silicon and hydrogen.

The trichlorosilane and dichlorosilane withdrawn as overhead from the distillation zone are then subjected to a temperature capable of causing the disproportionation thereof, resulting in the formation of product silane gas and by-product monochlorosilane and dichlorosilane. For this purpose, the di- and trichlorosilane overhead stream withdrawn from distillation zone 22 through line 25, after passing through reflux condenser 26 from which reflux is returned to said zone 22, first passes through line 27, including surge tank 28, to second distillation zone 29 from which trichlorosilane is removed as a bottoms stream through line 30, including surge tank 31 and pump 32, and is passed therefrom into first disproportionation reactor or reaction zone 33. This reactor contains insoluble, solid anion exchange resin containing tertiary amino or quaternary ammonium groups bonded to carbon and is maintained at a temperature capable of causing the disproportionation of trichlorosilane according to reaction (2) below:

(2) $2HSiCl_3 \rightarrow H_2SiCl_2 + SiCl_4$

The resulting dichlorosilane and silicon tetrachloride disproportionation products of reactor 33 are passed through line 34 to said first distillation column 22 for separation therein together with the trichlorosilane gas stream from hydrogenation reactor 4 as discussed above.

The overhead stream withdrawn from said second distillation zone 29 comprises dichlorosilane, monochlorosilane and product silane gas. This stream passes through line 35 to condenser unit 36 from which liquid dichlorosilane and monochlorosilane, apart from a reflux portion, are passed through line 37 to second disproportionation reactor or reaction zone 38 containing said anion exchange resin and in which dichlorosilane is dissociated according to reactions (3) and (4) below:

(3) $4H_2SiCl_2 \rightarrow 2H_3SiCl + 2HSiCl_3$
(4) $2H_3SiCl \rightarrow SiH_4 + H_2SiCl_2$ The resulting product silane, and by-product monochlorosilane and trichlorosilane produced in reactor 38 are passed through line 39 to said second distillation zone 29 for separation therein together with di- and trichlorosilane overhead stream withdrawn from first distillation zone 22 as discussed above. Thus, by-product mono-, di- and trichlorosilane withdrawn from either or both of said disproportionation reactors 33 and/or 38 are recycled either to distillation zone 22, or to said distillation zone 29 that constitutes a part of the overall disproportionation zone of the illustrated embodiment and that also includes, of course, said disproportionation reactors 33 and 38, for further separation and/or reaction. All of the by-product materials are recycled back for further use, therefore, with silicon tetrachloride being returned to hydrogenation reactor 4, with trichlorosilane being returned to first disproportionation reactor 33 and with dichlorosilane and monochlorosilane being returned to second disproportionation reactor 38. Silane gas thus becomes the only product of the overall process, with metallurgical silicon and hydrogen being essentially the only consumed materials.

High purity silane product is recovered from the disproportionation zone as the overhead in line 40 leaving condenser unit 36. While such high purity silane has utility as recovered, it is within the scope of the invention to subject said high purity silane to further treatment in a purification zone capable of assuring that the impurity content of the silane is at a semiconductor level. For this purpose, the high purity silane in line 40 is passed to purification zone 41 from which purified silane is withdrawn through line 42. Such purification zone may comprise a bed of activated carbon or a bed of silica gel. Alternately, the high purity silane may be distilled under pressure in said purification zone 41 comprising a cryogenic distillation zone. In this latter embodiment, the purified silane is removed as an overhead product from said cryogenic distillation zone, with trace quantities of monochlorosilane and residual impurities that may not have been removed by the ion exchange resins in reactors 33 and 38 of the distillation zone being separated from said purified silane in said cryogenic distillation zone.

One embodiment of the present invention involves the improved, integrated process for the production of polycrystalline silicon from metallurgical grade silicon. In this embodiment, the high purity silane from line 40, or advantageously, the purified silane from line 42, is passed advantageously to a silane decomposition zone represented generally by the numeral 43. The decomposition zone is maintained at a temperature within the decomposition range of silane, thereby causing said silane to decompose and to form high purity polycrystalline silicon and by-product hydrogen. The high purity silicon, which is separated from by-product hydrogen, is shown in the drawing as being withdrawn from said decomposition zone 43 through line 44 for further processing and use. By-product hydrogen, which is shown being withdrawn from decomposition zone 43 by line 45, can advantageously be employed in the overall integrated process of the invention. For example, said by-product hydrogen, or at least a portion thereof, can be passed to said reaction zone, i.e., hydrogenation reactor 4, for reaction therein with metallurgical silicon and silicon tetrachloride to form trichlorosilane as described above. In another application in the integrated process, said by-product hydrogen, or a portion thereof, can be employed to dilute the silane gas prior to its being introduced into said silane decomposition zone. In accordance with such overall, integrated processing features of the invention, silicon is recovered as a low-cost, high purity, polycrystalline product capable of being produced in decomposition zones, such as free space reactors or fluid bed reaction zones, at relatively high production rates on a semi-continuous or continuous basis. Therefore, metallurgical silicon is essentially the only consumed material apart from make-up of losses, in the process employing elevated pressure and temperature in the initial hydrogenation reaction zone, enhancing the production rate obtainable in said reaction zone and thus enhancing the overall process. The invention minimizes material wastage and simplifies waste disposal operations, thereby further enhancing the overall conversion of metallurgical grade silicon to high purity silicon for solar cell and semiconductor silicon applications.

A significant aspect of the present invention is the enhanced initial production of trichlorosilane from metallurgical grade silicon. Apart from the inherent advantages of the reaction of metallurgical silicon, hydrogen and silicon tetrachloride, said reaction is carried out at elevated pressure and temperature levels that substantially enhance the production rate obtainable in the hydrogenation reaction zone. The reaction zone is maintained at a temperature of from about 400° C. to about 600° C., preferably at from about 450° C. or 500° C. to about 550° C. The reaction zone, which may comprise a fluid bed, fixed bed or stirred bed, is maintained at pressure in excess of 100 psi, e.g., for practical commercial operations at a pressure of from about 300 psi to about 600 psi, preferably from about 400 psi to about 600 psi, although even greater yields may be obtained at pressures above 600 psi. Under such conditions, it has been found that the yield of trichlorosilane is significantly improved, said yield being in the order of 15-20 mole % at atmospheric reaction conditions, about 20-25% at 60 psi and over 30% at pressures greater than 100 psi. Larger quantities of the desired trichlorosilane are thus obtainable from smaller size reactors, this feature contributing significantly to the production of low-cost silane and silicon as compared with conventional processing. The production of trichlorosilane by the reaction of metallurgical silicon with HCl is about 300° C., by comparison, requires relatively large reaction vessels and produces a reaction product mixture containing appreciable quantities of polysilane, which results in additional processing costs not encountered in the practice of the present invention.

The hydrogenation reaction pressure, in practical commercial operations, is maintained generally within the range of from about 300 to about 600 psi to achieve the initial trichlorosilane formation in a technically and economically feasible manner. The restriction of the reaction pressure to this limited range is based upon the surprising and commercially significant discovery that an advantageous combination of desirable trichlorosilane yield and minimum undesired corrosion effects can be achieved thereby. The initial hydrogenation reaction, i.e., reaction (1) above, produces a reaction mixture capable of causing serious corrosion problems in the hydrogenation reactor. As previously noted, the reaction mixture contains about 20-30% by weight trichlorosilane, and a small amount of dichlorosilane, together with unreacted and recycled silicon tetrachloride, metallurgical silicon powder and metal halides as well as hydrogen chloride and hydrogen. In such an environment, corrosion of the reactor walls can become a significant operating problem in commercial applications of the overall process for the production of high purity silane and silicon from metallurgical grade silicon. This problem can have an adverse effect on the prospects for utilizing the process disclosed herein on a commercially practical basis as it runs counter to the need in the act to reduce costs and to simplify the requirements for producing high purity silane and silicon for solar cell and semiconductor applications. While higher than atmospheric reaction pressures have been proposed in order to increase mass throughput in the hydrogenation reactor, the reaction mixture would be expected to produce significant undesired corrosion at such higher pressures, particularly at elevated pressures in excess of 100 psi. By carrying out the initial hydrogenation reaction at a very elevated reaction pressure of from about 300 to about 600 psia, it has been discovered that, surprisingly and unexpectedly, the yield of trichlorosilane can be optimized while undesired corrosion effects can be minimized. The practice of the invention within the limited hydrogenation pressure range herein disclosed and claimed thus enables the overall high purity silane and silicon production process to be carried out in a manner enhancing the feasibility of employing the process in practical commercial operations.

Upon reaction of the steel walls of a hydrogenation reactor with the chloride ions present in the reaction mixture, metal chlorides are formed as corrosion products. As such metal chlorides, i.e., $FeCl_3$, are relatively volatile at the hydrogenation reaction pressures heretofore contemplated in the art, they tend to migrate away from the reactor wall surface, exposing fresh wall surface to the corrosive effects of the reaction mixture. Continuous processing operations will, under such circumstances, be subject to significant corrosion problems. Such problems, however, can be surprisingly and unexpectedly overcome by the practice of the invention, wherein the silicon tetrachloride present in the reaction mixture can be caused to remain always in the vapor phase. In its vapor phase, the silicon tetrachloride is readily removed from the reactor wall surfaces, whereas metal chlorides initially formed on the wall surface tend to remain thereon under the high pressure processing conditions of the invention. As a result, the metal chlorides form a protective layer against further corrosion of the wall surface, and the silicon tetrachloride instead of reacting further with fresh wall surfaces, is removed from the surface as vapor. The problem of corrosion, instead of being accelerated, is obviated by the use of very high reaction pressures in the recited range of from about 300 to about 600 psia.

The critical pressure of the reaction mixture of silicon tetrachloride vapor and hydrogen has been found to be about 275 psia. The critical pressure will be understood to be that above which only a single phase will be found to exist. Operation of the hydrogenation reaction above about 300 psia, therefore, will allow for a comfortable margin of tolerance, in practical commercial operations, to ensure that the silicon tetrachloride is maintained in the vapor phase, with the reactor wall surface protected by a layer of metal chlorides present on the surface thereof. It will be appreciated that, with very carefully controlled processing conditions the lower limit of the hydrogenation pressure can approach, while remaining above, the critical pressure pertaining to the reaction mixture of hydrogen and silicon tetrachloride. For this reason, it is herein disclosed and claimed that the hydrogenation reaction pressure, to achieve the surprising and unexpected reduction in undesired corrosion effects, should be maintained above the critical pressure of the mixture of hydrogen and silicon tetrachloride vapor and in the range of from about 300 to about 600 psia.

In carrying out the invention, the hydrogen and silicon tetrachloride being passed to the hydrogenation reactor can be premixed, with the mixture being heated to the desired reaction temperature at a pressure above the critical pressure of the mixture and generally in the range of from about 300 to about 600 psia. In a preferred embodiment for practical commercial operations, the hydrogen and the silicon tetrachloride are preheated separately and are mixed upon passage to the reaction zone, typically upon being injected into the feed end of the reactor. For this purpose, the hydrogen is heated to a temperature above the critical pressure of the mixture of hydrogen and silicon tetrachloride vapor and generally in the range of from about 300 to about 600 psia for convenient passage to the reaction zone at the desired hydrogenation pressure. The silicon tetrachloride is separately preheated to from about 400° C. to about 600° C. at a pressure in excess of the critical pressure of silicon tetrachloride and up to about 600 psia. The critical pressure of the silicon tetrachloride is about 530 psia so a more limited and higher pressure range pertains to the silicon tetrachloride when it is separately preheated. Within the desired pressure range above the critical pressure of silicon tetrachloride, a single phase exists, whereas at a lower pressure, a mixture of vapor and liquid silicon tetrachloride will exist. Under such conditions, a flashing of liquid silicon tetrachloride, with the vaporization of large amounts of liquid quickly, can create serious operational problems in the safety valves employed with the heat exchange equipment used to thus preheat the silicon tetrachloride to reaction temperature. When the desired hydrogenation reaction pressure is less than the pressure at which the silicon tetrachloride is preheated, it will be appreciated that the pressure of the preheated silicon tetrachloride vapor can be conveniently decreased by conventional means to the desired reaction pressure prior to being mixed with the separately preheated hydrogen upon passage to the hydrogenation reactor.

It has been determined that increased yields of trichlorosilane at hydrogenation pressures above about 600 psia are not accompanied by further decrease in corrosion effects, or other advantages, sufficient to justify operations above about 600 psia. The use of such higher pressures have the added disadvantage of potentially causing serious hydrogen embittlement of the metal walls of the reactor, with this potential becoming an increasing problem as the hydrogenation reaction pressure is increased above said 600 psia level. Another disadvantage of employing pressures above about 600 psia is the additional level of construction techniques, complexity and costs involved in the construction of commercial reaction vessels intended for operation above said 600 psia. For technical reasons and on an overall technical-economic basis, therefore, the hydrogenation reaction is carried out within the range of from about 300 to about 600 psia, and in any event above the critical pressure of the hydrogenation reaction mixture.

Thus, the carrying out of the initial hydrogenation reaction as described above enhances the overall process for converting metallurgical grade silicon to high purity silane and/or silicon. By facilitating the removal of silicon tetrachloride from the reactor wall surfaces and decreasing the volatility of the products of corrosion, the hydrogenation reaction pressures recited for use in the practice of the invention minimize undesired corrosion, while enabling optimum trichlorosilane yields to be achieved, in practical commercial operations. Such practical commercial operations are further facilitated and enhanced in the practice of the embodiment wherein the hydrogen and silicon tetrachloride vapor are conveniently preheated separately, at pressures in excess of the critical pressures referred to above, with the separately preheated reactants being passed to the hydrogenation reactor for admixture therein and reaction with silicon to produce optimum yields of trichlorosilane under commercially advantageous processing conditions.

While not essential, it is within the scope of the invention to employ a copper catalyst in the hydrogenation reactor zone. For this purpose, metallic copper or a mixture of said metallic copper and copper oxides, such as obtained by conventional copper precipitation processing, can be employed. Metallic copper will generally be employed at about 150 mesh, similar to ground up silicon, with said copper oxides being of fine range, such as about 10 microns in size. $Cu\, Cl_2$ is also operable for such purposes. The copper catalyst is employed in an amount within the range of from about 0.1% to about 5% by weight based on the overall weight of metallurgical silicon and said copper catalyst employed in the reaction zone.

The hydrogenation reaction zone of the invention constitutes a relatively small first stage of the overall process, utilizing an energy efficient sized reactor having decreased utility costs as compared with those that would be required at lower, more conventional, reaction pressure levels. It should be observed as noted above that, although relatively high reaction pressures are employed, such pressures do not require the additional level of contruction techniques, complexity and cost encountered in the construction of reaction vessels for operation at pressures greater than 600 psi. The simplified waste disposal operations of the invention are accomplished, as indicated above, by condensing a minor portion of the unreacted silicon tetrachloride in the trichlorosilane gas stream removed from the reaction zone in which silicon tetrachloride is separated from di-and trichlorosilane for recycle to the hydrogenation reaction zone. As such recycle is an important aspect of the overall processing advantages inherent in the integrated and improved process of the invention, it will be understood by those skilled in the art that the temperatures and pressures are adjusted so that as little silicon tetrachloride as possible is condensed to achieve the desired impurity removal, thereby maximizing the silicon tetrachloride available for recycle. By this convenient means, carryover metallurgical silicon powder, metal halides and other impurities present in the trichlorosilane gas stream from the hydrogenation reaction zone separate therefrom with said condensed silicon tetrachloride. Such impurities include metal halides, and small amounts of copper if such copper catalyst is employed. Because of the absence of appreciable quantities of the more hazardous polysilanes encountered in conventional processing, said unreacted silicon tetrachloride and accompanying silicon powder and impurities can be passed to waste without the necessity of diluting the waste stream with additional silicon tetrachloride prior to hydrolysis thereof during waste disposal.

It should be noted that the disproportionation reactions set forth above are, of themselves, well known in the art although the disproportionation reaction zone comprising reactors 33 and 38, second distillation zone 29 and related processing units, and its interaction with said first distillation zone 22, as shown in the drawing and as disclosed herein represents a novel and advantageous processing arrangement intended further to facilitate the objects of a low-cost, fully integrated process.

The disporportionation reactions are carried out in reactors 33 and 38 in the presence, for example, of insoluble, solid anion exchange resins containing tertiary amino or quaternary ammonium groups bonded to carbon, with such resins that are macroreticular and that contain tertiary amino groups being generally preferred. Such resins, including the commercial macroreticular tertiary amine ion exchange resin produced by Rohm and Haas Company and sold under its Amberlyst A-21 trademark, are described in detail in U.S. Pat. No. 3,968,199, in the name of Carl J. Bakay. The Bakay patent also describes the generally known features of the disproportionation reactions. It should be noted that it is convenient, for purposes of the present invention to employ said resin in an amount generally on the order of about 20 lbs. of resin per lb./hr. of product silane produced in said disproportionation reactors can be operated in either vapor phase or liquid phase although it has been found generally advantageous to operate reactor 33 in the vapor phase, with temperatures of about 80° C. and up to about 150° C., and to operate reactor 38 in the liquid phase, with temperatures of about 55°-60° C. and down as low as about 0° C. Those skilled in the art will appreciate that any suitable, commercially available disproportionation catalyst capable of facilitating the desired disporportionation of trichlorosilane to dichlorosilane, and from dichlorosilane to monochlorosilane and ultimately to silane, at the disproportionation temperature employed can be utilized in the practice of the invention. The anion exchange resins referred to above, however, have been found highly desirable for the intended purpose. It will also be appreciated that the disproportionation of trichlorosilane can be carried out to a lesser degree than to the silane production herein disclosed and claimed. For example, the trichlorosilane advantageously formed as set forth above can be passed to a disproportionation zone for conversion to dichlorosilane without providing for further disproportionation to silane. The dichlorosilane can thereafter be passed to a free space reaction zone, to a fluid bed reaction zone or to any other suitable decomposition zone maintained at a temperature sufficient to cause the decomposition of the dichlorosilane to silicon.

The high purity silane removed from the disproportionation zone is of about 97–99% purity and may contain from about 1–3% monochlorosilane. Such chlorine material is the only significant impurity normally present in the product silane, which is essentially free of electronically active impurities such as boron. As indicated above, said high purity silane may be purified, by passage through purification zone 41, to assure that the silane is of semiconductor purity quality. The purification zone can be in the form of carbon traps, comprising beds of activated carbon, that will remove monochlorosilane from the silane product gas stream. Silica gel or other commercially available adsorbents may also be employed for such purposes. Alternately, said purification zone 41 may comprise a cryogenic distillation zone in which the high purity silane is distilled under pressure, with purified silane being removed as an overhead product. Trace quantities of monochlorosilane and residual impurities that may not have been removed by said ion exchange resin in the disproportionation zone are separated from said purified silane in said cryogenic distillation zone. The cryogenic zone would be operated to assure that diborane, $B_2H_6$, the lowest boiling electronically active impurity, boiling point $-93°$ C., is separated from the silane product, boiling poing $-112°$ C. More broadly, the practice of the invention results in all by-products, intermediate products and/or unreacted materials, together with impurities present in the system, being rejected back into the system, with high purity or purified silane being separated therefrom. Thus, silicon tetrachloride passes back ultimately to hydrogenation reactor 4, trichlorosilane eventually returns to disproportionation reactor 33, and mono- and dichlorosilane to reactor 38, with most impurities being withdrawn from the system in the sludge of material removed from settler zone 10 through line 15. Any boron trichloride, boiling point $-12°$ C., that was not removed in said sludge or retained on the ion exchange resin in reactors 33 and/or 38 could be removed from the silane in said purification zone 41. It will be appreciated by those skilled in the art that various other steps could be employed to further assure that the product silane is of semiconductor purity, having impurities present only at parts per billion levels, rather than at levels on the order of about 0.05% or 500 parts per million. It will also be appreciated that such purification steps as indicated herein might, in practice, constitute redundant features useful primarily on that basis. For example, the cryogenic distillation step is useful to remove boron impurities if such impurities are present in the product stream removed from the disproportionation zone. Such impurities may not be present in significant amounts, however, as a result of removal by the ion exchange resins of the disproportion reactors as indicated above. In addition, it is possible to subject the trichlorosilane stream to purification prior to disproportionation by means of severe distillation in an extra distillation zone and boron removal by water vapor treatment utilizing the technique of U.S. Pat. No. 3,540,861 or by other known techniques, including those utilizing amine ion exchange resins such as those suitable as disproportionation catalysts in the present invention. The removal of residual chlorine materials is desired, on the other hand, to avoid undesired corrosion in the subsequent pyrolysis of silane to form high purity polycrystalline silicon. The use of possibly redundant purification steps merit consideration in determining an appropriate, practical commercial operation as a balance or trade off between a desire to minimize the cost of producing silane and silicon products on a relatively large scale and the need to take prudent steps to assure the desired quality of the products on a continuous or semi-continuous basis in commercial scale operations.

In the embodiments of the invention in which high purity silicon is to be produced, the silane obtained as disclosed above is passed to a silane decomposition zone, represented generally by the numeral 43 in the drawing, in which the silane is decomposed to form high purity polycrystalline silicon and by-product hydrogen according to the following reaction:

(5) $Si\ H_4 \rightarrow Si + 2H_2$

The silicon thus obtained can readily be separated from by-product hydrogen and recovered for further refinement or use. In one embodiment, said high purity polycrystalline silicon can be passed, preferably directly, to a melting zone maintained at a temperature above the melting point of silicon, thereby obtaining a high purity, polycrystalline silicon melt from which high purity single crystal silicon can be obtained by known crystal pulling techniques for use in solar cell or semiconductor applications.

It is within the scope of the invention to decompose silane on a continuous or semi-continuous basis at relatively high production rates, overcoming the inherent disadvantages and limitations of the Siemens process, utilizing either a free space reactor or a fluidized bed reactor. In the free space reactor approach, high purity polycrystalline powder is conveniently produced by introducing silane into the hot free space of a decomposition zone maintained at a temperature within the decomposition temperature range of the silane and below the melting point temperature of silicon, i.e. from about 390° C. to about 1400° C., preferably from about 800° C. to about 1000° C. As a result of the homogeneous decomposition of the silane within the free space reactor, polycrystalline silicon powder is formed together with by-product hydrogen. The decomposition can be carried out at essentially atmospheric conditions or at elevated pressures up to 100 psi or above, with elevated pressures tending to form higher silicon production rates and the formation of larger particles, which generally range from submicron to low micron size, e.g. 5μ. The silane feed gas is preferably introduced into the free space zone turbulently, as by injector means positioned at the top of the reactor, with the turbulence tending to minimize heterogeneous decomposition at the reactor wall and consequent silicon wall deposit build-up. The silicon powder of high purity, upon discharge from the decomposition reactor, may be consolidated or melted for further processing by conventional means to produce a low-cost, high purity single crystal material. In passing the silicon powder from the settling zone in which it is separated from by-product hydrogen, typically within the reactor itself, the silicon powder can advantageously be passed directly to a melting zone, without outside contact, so as to minimize exposure of the product polycrystalline silicon to sources of potential impurities, thereby assuring the high quality of the product silicon. Alternately, the silicon powder may be passed to a consolidation zone to form larger sized silicon particles for subsequent treatment or use.

In another embodiment of the invention, the silane decomposition zone comprises a fluid bed silicon reaction zone. In this embodiment, silane is injected into the reaction chamber containing particles of elemental silicon small enough to be fluidized by the injected silane gas. The fluidized bed of silicon particles are maintained at a temperature within the thermal decomposition range and below the melting point of silicon. By the heterogeneous decomposition of the silane, the desired silicon product is deposited on the fluidized bed particles, which increase in size until removed from the reaction chamber as product. Seed particles for the fluidized bed are formed by the grinding of a portion of the product silicon particles in a manner avoiding the introduction of impurities into said seed particles.

The by-product hydrogen formed upon decomposition of silane in the free space reactor or in a fluid bed reactor can be effectively utilized in the integrated process of the invention. For example, the silane feed to the decomposition zone is advantageously diluted with at least a portion of said by-product hydrogen prior to being introduced into said zone. Likewise, said by-product hydrogen, or at least a portion thereof, can be effectively utilized by being passed to the hydrogenation reaction zone for reaction therein with metallurgical grade silicon and silicon tetrachloride in the initial step of forming the trichlorosilane gas stream from which silane is produced as herein described.

The process of the invention has been employed in the production of silane in accordance with the embodiment illustrated in the drawing, with metallurgical grade silicon, hydrogen and silicon tetrachloride being reacted in reactor 4 with said silicon and hydrogen being employed in approximately a 1:2 mole ratio. The hydrogen and silicon tetrachloride, employed in a 1:1 mole ratio, were preheated to 500° C. and pressurized to 325 psig prior to being introduced into reactor 4. The trichlorosilane gas stream leaving reactor 4 was at 500° C. and 300 psig. Condenser unit 12 was employed to condense a portion of the silicon tetrachloride content, i.e. about 5%, said silicon tetrachloride carryover silicon powder and impurities being withdrawn from the system through settler 10, the waste stream being discharged through line 15. One portion of condenser unit 12 was operated at 25° C. for this purpose, the other portion thereof being operated at about −15° C. with recycle hydrogen in line 16 thus being recycled at −15° C. The trichlorosilane stream in line 21 was fed to distillation column 22 at 25° C. and 50 psig., with recycle silicon tetrachloride exiting from said column 22 at 124° C. and 50 psig. The di- and trichlorosilane stream removed from column 22 is passed, at 65° C. and 50 psig, through line 27 to tank 28 and into column 20 from which trichlorosilane is passed through line 30 at 70° C. and 40 psig for redistribution in disproportionation reactor 33, from which dichlorosilane and silicon tetrachloride are recovered at 80° C. and 50 psig. The overhead stream from column 29 passes through line 35 to condenser unit 36 that is operated, in the first stage thereof at −30° C. and in the second at −60° C., so as to separate and recover product silane in line 40 and to return all other materials to the system as reflux to column 29 and as the liquid stream in line 37 passed to disproportionation reactor 38. The stream in line 37 was at 0° C. and 40 psig, with the redistribution mixture leaving said reactor 38 being at 55° C. and 40 psig. High purity silane was recovered in line 40 at −40° C. and 40 psig and was passed to purification zone 41 in which carbon traps were employed to remove monochlorosilane from the high purity silane product.

In commercial embodiments of the invention, the hydrogen and silicon tetrachloride employed in accordance with the preceeding example can be premixed and heated to said 500° C. at a pressure in excess of the critical pressure of the mixture of hydrogen and silicon tetrachloride vapor, i.e. at said 325 psig, prior to being introduced into reactor 4. Alternately and desirably in practical applications of the invention, the hydrogen can be preheated to 500° C. at the desired reaction pressure of 325 psig, while the silicon tetrachloride is separately preheated to said 500° C. at a pressure of about 575 psig, i.e. somewhat above the critical pressure of 530 psig for silicon tetrachloride. The then preheated silicon tetrachloride can thereafter be depressurized to said 325 psig and passed to reactor 4 for mixture therein with the separately preheated hydrogen for reaction with metallurgical grade silicon to form the trichlorosilane gas stream as indicated above, with the latter stream being thereafter treated as in the example above.

It will be appreciated by those skilled in the art that various changes and modifications can be made in the particular arrangement of disproportionation reactors and supporting apparatus as shown in the disproportionation zone and its relationship to the distillation zone of the illustrated embodiment of the invention. Said embodiment, however, represents an advantageous arrangement intended to simplify the necessary processing apparatus and thus to contribute to the overall object of enabling high purity silane and silicon to be produced at relatively large production rates on a semi-continuous or continuous basis at relatively low cost.

The invention achieves such objective through the integrated nature of the process, with simplified waste disposal, the recycle of all by-product and unreacted materials other than product silane, and, significantly, by the overall improvements to the overall process and the cost thereof achieved by carrying out the initial hydrogenation of metallurgical silicon and by-product silicon tetrachloride under conditions of elevated temperature and pressure such as to reduce the necessary apparatus size and to increase the yield of trichlorosilane. This latter feature, which is an essential feature of the invention as claimed herein, thus contributes in an appreciable manner to the necessary decrease in the cost of producing polycrystalline semiconductor grade silicon so as to enhance the prospects for employing such silicon in the production of solar cells for commercial application and in other desirable commercial semiconductor applications. By means of the integrated process of the present invention, high purity silane and silicon can be produced, in an economically feasible manner, from metallurgical grade silicon with such metallurgical grade material and hydrogen being essentially the only consumed feed material and with waste disposal being facilitated in an environmentally attractive manner.

I claim:
1. An improved process for the production of silane from metallurgical grade silicon comprising:
   (a) reacting metallurgical silicon with hydrogen and silicon tetrachloride in a reaction zone maintained at a temperature of from about 400° C. to about 600° C. and at a pressure above the critical pressure of the mixture of hydrogen and silicon tetrachloride vapor and in the range of from about 300 to about 600 psi to form trichlorosilane and dichlorosilane said reaction zone comprising an iron-containing reactor susceptible to corrosion in the presence of said reaction mixture;
   (b) separating said trichlorosilane and dichlorosilane as overhead from unreacted silicon tetrachloride in a distillation zone;
   (c) recycling separated silicon tetrachloride from said distillation zone to said reaction zone for reaction with additional quantities of metallurgical silicon and hydrogen;
   (d) subjecting said trichlorosilane and dichlorosilane to a temperature capable of causing the disproportionation thereof in a disproportionation reaction zone containing said disproportionation constituting reactions resulting in the formation of product silane and by-product mono-, di- and trichlorosilane and silicon tetrachloride;
   (e) recycling said by-product mono-, di- and trichlorosilane and silicon tetrachloride to said distillation zone and said disproportionation reaction zone for further separation and disproportionation therein, and
   (f) recovering high purity silane from said disproportionation zone, said reaction pressure enables an advantageous combination of desirable trichlorosilane yield and minimum and desired corrosion effects to be achieved in the reaction zone, facilitating the overall production of silane from metallurgical grade silicon in pratical commercial operations.

2. The process of claim 1 in which said reaction zone temperature is from about 450° C. to about 550° C.

3. The process of claim 1 in which said reaction zone pressure is from about 400 to about 600 psi.

4. The process of claim 1 in which said reaction zone comprises a fluid bed reaction zone.

5. The process of claim 1 in which said disproportionation catalyst comprises insoluble, solid anion exchange resin containing tertiary amino or quaternary ammonium groups bonded to carbon.

6. The process of claim 1 and including premixing said hydrogen and silicon tetrachloride and heating the mixture to said reaction temperature at a pressure above the critical pressure of the mixture and in the range of from about 300 to about 600 psi.

7. The process of claim 1 and including preheating said hydrogen to from about 400° C. to about 600° C. at a pressure above the critical pressure of the mixture of hydrogen and silicon tetrachloride vapor and in the range of from about 300 to about 600 psi, and separately preheating said silicon tetrachloride to from about 400° C. to about 600° C. at a pressure in excess of the critical pressure of silicon tetrachloride and up to about 600 psi, with said preheated silicon tetrachloride being passed to the reaction zone at the desired reaction pressure above said critical pressure of the mixture of hydrogen and silicon tetrachloride and in said range of from about 300 to about 600 psi, said separatedly preheated hydrogen and silicon tetrachloride being mixed upon passage to the reaction zone.

8. The pressure of claim 7 in which the reaction zone temperature is from about 450° C. to about 550° C.

9. The process of claim 5 in which said ion exchange resin is macroreticular and contains tertiary amino groups.

10. An improved process for the production of polycrystalline silicon from metallurgical grade silicon comprising:
   (a) reacting metallurgical silicon with hydrogen and silicon tetrachloride in a reaction zone maintained at a temperature of from about 400° C. to about 600° C. and at a pressure above the critical pressure of the mixture of hydrogen and silicon tetrachloride vapor and in the range of from about 300 to about 600 psi to form trichlorosilane and dichlorosilane said reaction zone comprising an iron-containing reactor susceptible to corrosion in the presence of said reaction mixture;
   (b) separating said trichlorosilane as overhead from unreacted silicon tetrachloride in a distillation zone;
   (c) recycling separated silicon tetrachloride from said distillation zone to said reaction zone for reaction with additional quantitites of metallurgical silicon and hydrogen;
   (d) subjecting said trichlorosilane to a temperature capable of causing the disproportionation thereof in a disproportionation reaction zone containing a disproportionation catalyst, said disproportionation constituting reactions resulting in the formation of silane gas and mono-, di- and trichlorosilane and silicon tetrachloride;
   (e) recycling said mono, di-, and trichlorosilane and silicon tetrachloride and unreacted trichlorosilane to said distillation zone and said disproportionation reaction zone for further separation and disproportionation therein;
   (f) passing silane formed in said disproportionation reaction zone to a silane decomposition zone maintained at a temperature within the decomposition temperature range of silane, thereby causing said silane to decompose and to form high purity polycrystalline silicon and by-product hydrogen;
   (g) separating said high purity silicon from said by-product hydrogen, whereby said reaction pressure enables an advantageous combination of desirable trichlorosilane yield and minimum undesired corrosion effects to be achieved in the reaction zone, facilitating the overall production of high purity silicon from metallurgical grade material in practical commercial operations.

11. The process of claim 10 in which said reaction zone is maintained at a temperature of from about 450° C. to about 550° C.

12. The process of claim 10 in which said reaction zone pressure is from about 400 to about 600 psi.

13. The process of claim 12 in which said reaction zone comprises a fluid bed reaction zone.

14. The process of claim 10 in which said disproportionation catalyst comprises insoluble, solid anion exchange resin containing tertiary amino or quaternary ammonium groups bonded to carbon.

15. The process of claim 14 in which said ion exchange resin is macroreticular and contains tertiary amino groups.

16. The process of claim 10 and including passing said high purity silicon separated from by-product hydrogen to a melting zone maintained at a temperature above the melting point of silicon, thereby obtaining a high purity, polycrystalline silicon melt from which high purity single crystal silicon can be obtained for solar cell or semiconductor applications.

17. The process of claim 10 in which said silane decomposition zone comprises the hot free space zone of a decomposition reactor, said silicon being formed as a silicon powder and including passing said silicon powder and by-product hydrogen from said free space zone to a separation zone for said separation of silicon powder from by-product hydrogen, said silicon powder being passed from said separation zone to said melting zone so as to minimize exposure of said product silicon to sources of potential impurities, thereby assuring the high quality of the product polycrystalline silicon.

18. The process of claim 10 in which said silane decomposition zone comprises a fluid bed silicon reaction zone containing a bed of silicon particles upon which silicon is deposited by the heterogeneous decomposition of silane within said decomposition zone.

19. The process of claim 10 and including premixing said hydrogen and silicon tetrachloride and heating the mixture to said reaction temperature at a pressure above the critical pressure thereof and in the range of from about 300 to about 600 psi.

20. The process of claim 10 and including preheating said hydrogen to from about 400° C. to about 600° C. at a pressure above the critical pressure of the mixture of hydrogen and silicon tetrachloride and in the range of from about 300 to about 600 psi, and separately preheating said silicon tetrachloride vapor to from about 400° C. to about 600° C. at a pressure in excess of the critical pressure of silicon tetrachloride and up to about 600 psi, with said preheated silicon tetrachloride being passed to the reaetion zone at the reaction pressure above said critical pressure of the mixture of hydrogen and silicon tetrachloride and in said range of from about 300 to about 600 psi, said separately preheated hydrogen and silicon tetrachloride being mixed upon passage to the reaction zone.

21. The process of claim 20 in which the reaction pressure is less than the pressure at which the silicon tetrachloride is preheated, and including decreasing the pressure of said preheated silicon tetrachloride to the reaction pressure prior to being mixed with the separately preheated hydrogen.

22. The process of claim 20 in which the reaction zone is maintained at a temperature of from about 450° C. to about 550° C.

* * * * *